US010600772B2

(12) United States Patent
Sukekawa

(10) Patent No.: US 10,600,772 B2
(45) Date of Patent: Mar. 24, 2020

(54) SEMICONDUCTOR MEMORY DEVICE HAVING PLURAL CHIPS CONNECTED BY HYBRID BONDING METHOD

(71) Applicant: MICRON TECHNOLOGY, INC., Boise, ID (US)

(72) Inventor: Mitsunari Sukekawa, Higashihiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/446,491

(22) Filed: Jun. 19, 2019

(65) Prior Publication Data

US 2019/0363074 A1  Nov. 28, 2019

Related U.S. Application Data

(63) Continuation of application No. 15/986,697, filed on May 22, 2018, now Pat. No. 10,340,261.

(51) Int. Cl.
| | |
|---|---|
| *H01L 25/18* | (2006.01) |
| *G11C 11/408* | (2006.01) |
| *H01L 23/522* | (2006.01) |
| *H01L 23/528* | (2006.01) |
| *H01L 23/00* | (2006.01) |

(Continued)

(52) U.S. Cl.
CPC .............. *H01L 25/18* (2013.01); *G11C 5/066* (2013.01); *G11C 11/4085* (2013.01); *G11C 11/4091* (2013.01); *H01L 23/528* (2013.01); *H01L 23/5226* (2013.01); *H01L 24/08* (2013.01); *H01L 24/09* (2013.01); *H01L*

*25/065* (2013.01); *H01L 25/0657* (2013.01); *H01L 25/117* (2013.01); *H01L 27/10805* (2013.01);
(Continued)

(58) Field of Classification Search
CPC . H01L 25/065; H01L 25/0657; H01L 25/117; G11C 5/066
USPC .......................................................... 365/63
See application file for complete search history.

(56) References Cited

U.S. PATENT DOCUMENTS

2004/0178819 A1   9/2004  New
2009/0128188 A1*  5/2009  Madurawe ....... H03K 19/17736
                                                          326/39

(Continued)

FOREIGN PATENT DOCUMENTS

JP        11251542         9/1999

OTHER PUBLICATIONS

PCT Application No. PCT/US2019/032586 titled "Semiconductor Memory Device Having Plural Chips Connected by Hybrid Bonding Method" filed on May 16, 2019.

(Continued)

*Primary Examiner* — David Vu
*Assistant Examiner* — Brandon C Fox
(74) *Attorney, Agent, or Firm* — Dorsey & Whitney LLP

(57) ABSTRACT

Disclosed herein is an apparatus that includes a first semiconductor chip including a plurality of memory cell arrays and a plurality of first bonding electrodes electrically connected to the memory cell arrays, and a second semiconductor chip including a logic circuits and a plurality of second bonding electrodes electrically connected to the logic circuits. The first and second semiconductor chips are stacked with each other so that each of the first bonding (Continued)

electrodes is electrically connected to an associated one of the second bonding electrodes.

20 Claims, 9 Drawing Sheets

(51) Int. Cl.
    *G11C 11/4091*      (2006.01)
    *H01L 25/065*      (2006.01)
    *G11C 5/06*      (2006.01)
    *H01L 25/11*      (2006.01)
    *H01L 27/108*      (2006.01)

(52) U.S. Cl.
    CPC ............ *H01L 2224/08145* (2013.01); *H01L 2924/1431* (2013.01); *H01L 2924/1436* (2013.01)

(56) References Cited

U.S. PATENT DOCUMENTS

| | | | |
|---|---|---|---|
| 2013/0091315 A1 | 4/2013 | Ken et al. | |
| 2014/0264730 A1* | 9/2014 | Haba | H01L 23/5256 |
| | | | 257/529 |
| 2014/0328104 A1 | 11/2014 | Jeon et al. | |
| 2015/0287706 A1 | 10/2015 | Sukekawa | |
| 2016/0247859 A1 | 8/2016 | Takaki | |
| 2017/0069369 A1* | 3/2017 | Kim | G11C 11/4093 |
| 2018/0012867 A1* | 1/2018 | Kim | H01L 24/14 |
| 2019/0221269 A1* | 7/2019 | Nguyen | G11C 16/0483 |

OTHER PUBLICATIONS

International Search Report and Written Opinion dated Sep. 6, 2019 for PCT application No. PCT/US2019/032588, 9 pages.

\* cited by examiner

SEMICONDUCTOR MEMORY DEVICE HAVING PLURAL CHIPS CONNECTED BY HYBRID BONDING METHOD

CROSS-REFERENCE TO RELATED APPLICATION

This application is a continuation of U.S. patent application Ser. No. 15/986,697, filed May 22, 2018. This application is incorporated by reference herein in its entirety and for all purposes.

BACKGROUND

There is known a method employed in a semiconductor device such as a DRAM (Dynamic Random Access Memory), in which a memory chip having memory cell arrays and a logic chip having a logic circuit including sense amplifiers and word drivers are fabricated on two different wafers, respectively, and the resultant two wafers are hybrid bonded. According to this method, the memory cell array and logic circuit can be fabricated by separate processes, thereby allowing the individual process conditions to be optimized.

However, the arrangement pitch of bit lines or sub-word lines formed on a memory chip is significantly smaller than the arrangement pitch of bonding electrodes used in the hybrid bonding. Therefore, in semiconductor devices of this type, both the memory chip and the logic chip require a wiring layer for pitch conversion. Details of this are disclosed in US 2015/0287706 A1 filed by the present inventor. The memory chip disclosed in 2015/0287706 A1 has a configuration in which a plurality of memory cell arrays are laid out in a matrix (in both the bit line direction and the sub-word line direction), so that a wiring for transmitting a signal asynchronous with operation of the memory cell array passes a sense amplifier region or a sub-word driver region, with the result that noise may easily be superimposed on the sub-word line or bit line.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
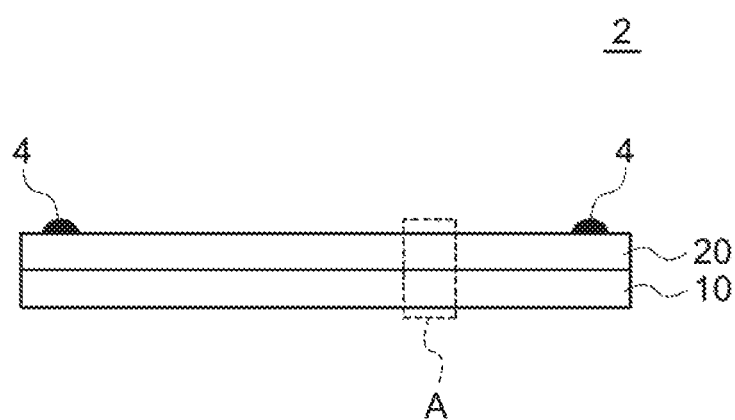
FIG. 1 is a schematic diagram illustrating an outer appearance of a semiconductor device according to a first embodiment.

As illustrated in FIG. 1, a semiconductor device 2 according to a first embodiment of the present invention has a configuration in which a memory chip 10 and a logic chip 20 are laminated. A plurality of external terminal electrodes 4 are formed on the surface of the logic chip 20.

Figure 2:
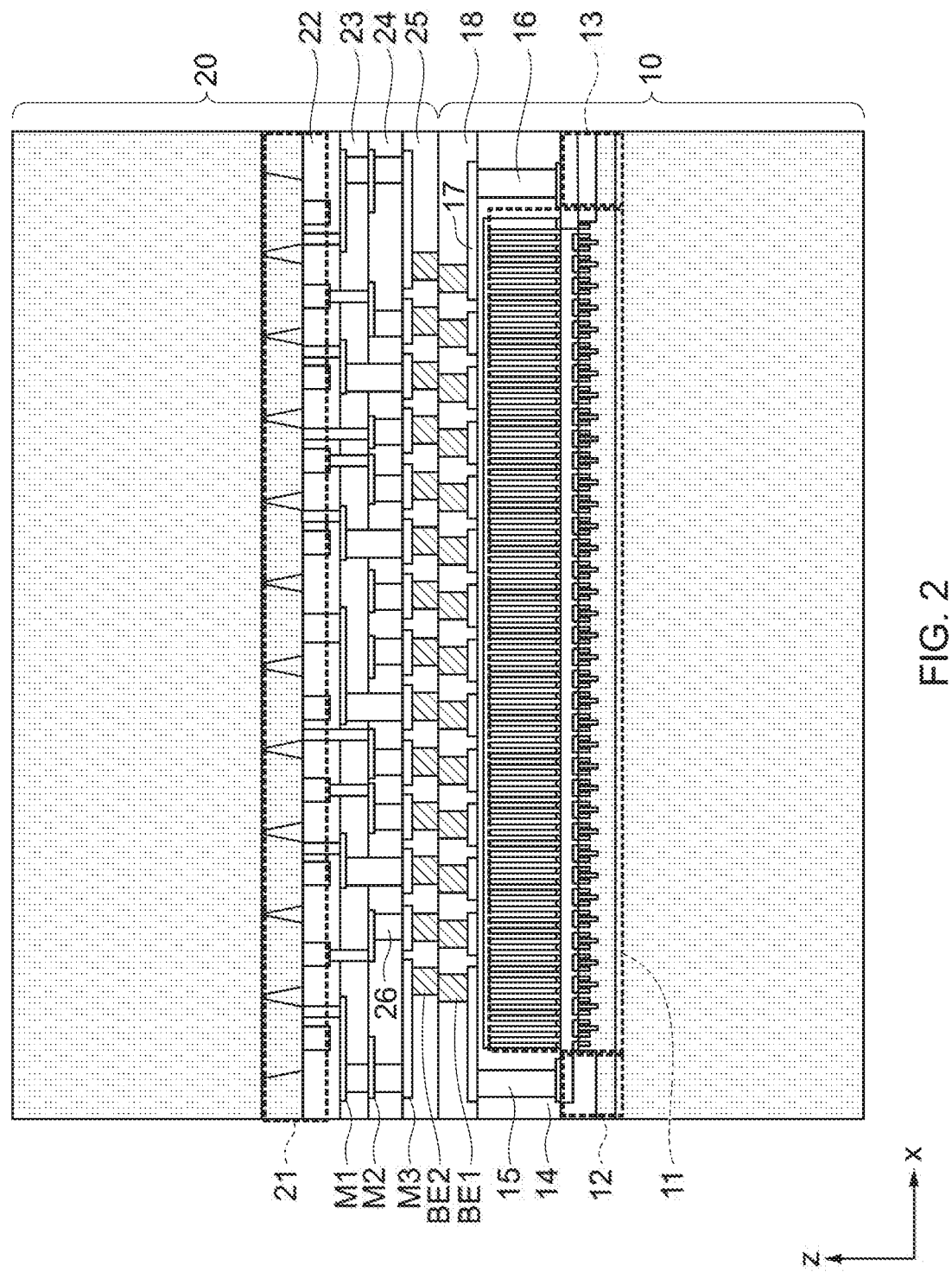
FIG. 2 is a schematic cross-sectional view of a region A shown in FIG. 1.

As illustrated in FIG. 2, the memory chip 10 has a memory cell array 11 including a plurality of memory cells, a bit line connection region 12 and a word line connection region 13. The bit line connection region 12 is connected to a bit line in the memory cell array 11. The word line connection region 13 is connected to a sub-word line in the memory cell array 11. The bit line and the sub-word line in the memory cell array 11 cross each other. The memory cell array 11, the bit line connection region 12, and the word line connection region 13 are covered with an interlayer dielectric film 14. The bit fine connection region 12 is connected to an overlaying wiring layer 17 via conductor 15 penetrating the interlayer dielectric film 14. The word line connection region 13 is connected to the overlaying wiring layer 17 via conductor 16 penetrating the interlayer dielectric film 14. The wiring layer 17 is covered with an interlayer dielectric film 18. The wiring layer 17 is a layer provided for pitch conversion. Wirings on the wiring layer 17 are connected to a plurality of bonding electrodes BE1 exposed from the upper surface of the interlayer dielectric film 18.

The logic chip 20 has a transistor region 21 including a plurality of transistors constituting a sense amplifier or a word driver and interlayer dielectric films 22 to 25 that cover the transistor region 21. Wiring layers M1, M2, and M3 are formed on the interlayer dielectric films 22, 23, and 24, respectively. The wiring layers M1, M2, and M3 are mutually connected via conductor 26 penetrating the interlayer dielectric films 23 and 24. Wirings on the wiring layer M3 are connected to a plurality of bonding electrodes BE2 exposed from the upper surface of the interlayer dielectric film 25.

The memory chip 10 and the logic chip 20 are hybrid bonded such that the bonding electrodes BE1 and the bonding electrodes BE2 are properly aligned. As a result, bit lines and sub-word lines provided on the memory chip 10 are electrically connected to the transistor region 21 provided on the logic chip 20.

Figure 3:
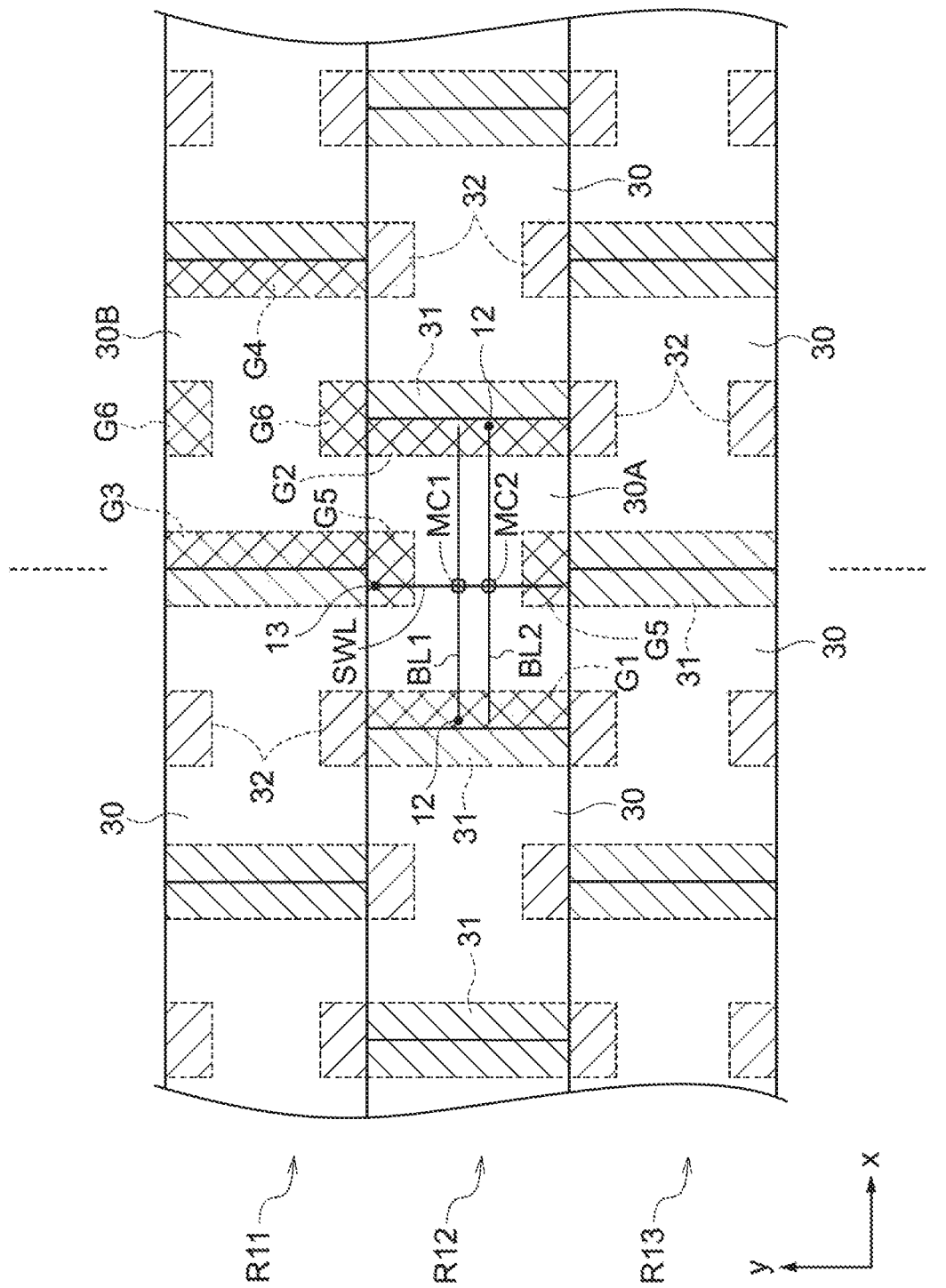
FIG. 3 is a schematic plan view of a memory chip according to an embodiment of the disclosure.

As illustrated in FIG. 3, the memory chip 10 has a plurality of memory cell arrays 30. The memory chip 10 according to the present embodiment has memory cell array rows R11, R12, R13, . . . in each of which the plurality of memory cell arrays 30 are arranged in the x-direction, and the memory cell array rows R11, R12, R13, . . . are arranged in the y-direction. The x-direction positions of the memory cell array 30 constituting the memory cell array rows adjacent to each other in the y-direction are shifted by a half pitch, with the result that the memory cell arrays 30 are arranged in staggered manner. For example, the x-direction positions of the memory cell array 30 constituting the memory cell array row R11 and the x-direction positions of the memory cell array 30 constituting the memory cell array row R12 are shifted by a half pitch, and the x-direction positions of the memory cell array 30 constituting the memory cell array row R12 and the x-direction positions of the memory cell array 30 constituting the memory cell array row R13 are shifted by a half pitch. The x-direction positions of the memory cell array 30 constituting the memory cell array row R11 and the x-direction positions of the memory cell array 30 constituting the memory cell array row R13 are aligned. However, the shift amount in the x-direction between the memory cell arrays 30 adjacent in the y-direction need not be a ½ pitch but may be a ⅓ pitch. Further, not all memory cell arrays 30 adjacent in the y-direction need to be shifted in the x-direction, and the x-direction positions of some memory cell arrays 30 adjacent in the y-direction may be aligned.

The memory cell array 30 is defined by the extending ranges of a bit line BL extending in the x-direction and a sub-word line SWL extending in the y-direction. Thus, the size of the memory cell array 30 in the x-direction is almost the same as the length of one bit line BL in the x-direction, and the size of the memory cell array 30 in the y-direction is almost the same as the length of one sub-word line SWL in the y-direction. In FIG. 3, two bit lines BL1 and BL2 and one sub-word line SWL are illustrated, and memory cell arrays MC1 and MC2 are disposed at intersections between them. The end portions of the bit lines BL1 and BL2 are connected to a sense amplifier provided on the logic chip 20 via the bit line connection region 12. The end portion of the sub-word line SWL is connected to a sub-word driver provided on the logic chip 20 via the word line connection region 13. The memory chip 10 according to the present embodiment has a so-called open bit configuration, so that one (e.g., bit line BL1) of the two bit lines included in one memory cell array 30 is connected to the bit line connection region 12 positioned at one end in the x-direction, and the other one (e.g., bit line BL2) is connected to the bit line connection region 12 positioned at the other end in the x-direction.

A bit line bonding region 31 in which the bonding electrodes BE1 corresponding to the bit line BL are disposed is provided at a portion overlapping the bit line connection region 12. Further, a word line bonding region 32 in which the bonding electrodes BE1 corresponding to the sub-word line SWL are disposed is provided at a portion overlapping the word line connection region 13. In the present embodiment, the bit line bonding region 31 is disposed at both end portions of each memory cell array 30 in the x-direction, and the word line bonding region 32 is disposed at both end portions of each memory cell array 30 in the y-direction. The plurality of bonding electrodes BE1 disposed in the bit line bonding region 31 or the word line bonding region 32 constitute a group.

For example, the bonding electrodes BE1 corresponding to the bit line BL of the memory cell array 30A illustrated in FIG. 3 constitute a first group G1 connected to one bit line BL and a second group G2 connected to the other bit line BL. Similarly, the bonding electrodes BE1 corresponding to the bit line BL of the memory cell array 30B constitute a third croup G3 connected to one bit line BL and a fourth group G4 connected to the other bit line BL. As described above, in the present embodiment, the memory cell arrays 30 are arranged in zigzag, so that the group G3 is positioned between the group G1 and the group G2 in the x-direction, and the group G2 is positioned between the group G3 and the group G4 in the x-direction. The bonding electrodes BE1 corresponding to the sub-word line SWL of the memory cell array 30A constitute a fifth group G5. Similarly, the bonding electrodes BE1 corresponding to the sub-word line SWL of the memory cell array 30B constitute a sixth group G6. The x-direction position of the fifth group G6 overlaps the x-direction position of the third group G3, and the x-direction position of the sixth group G6 overlaps the x-direction position of the second group G2.

Figure 4:
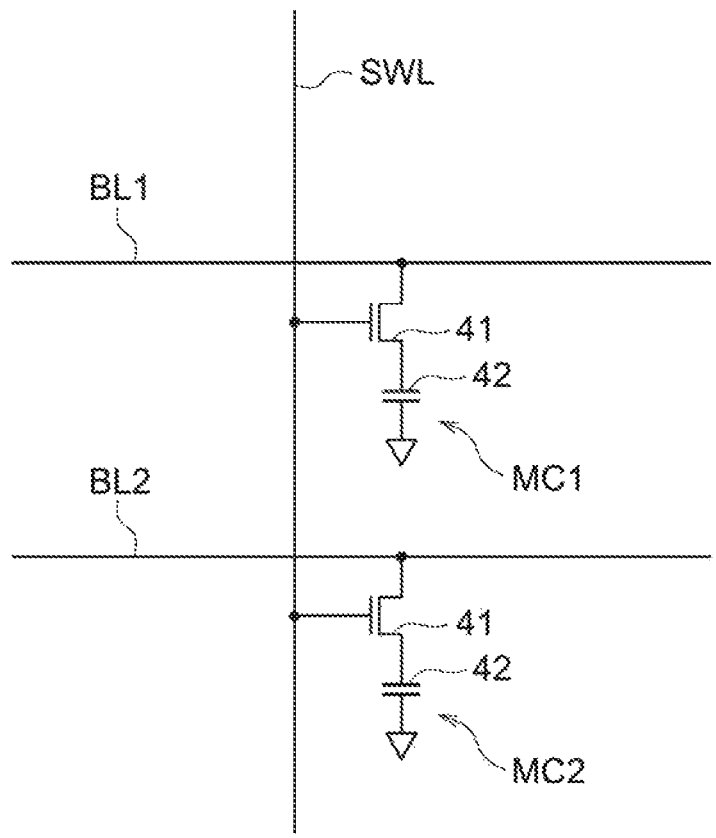
FIG. 4 is a circuit diagram of a memory cell according to an embodiment of the disclosure.

As illustrated in FIG. 4, memory cells MC1 and MC2 are each a DRAM cell composed of a cell transistor 41 and a cell capacitor 42 which are connected in series. The gate electrode of the cell transistor 41 is connected to its corresponding sub-word line SWL, one of the source and drain of the cell transistor 41 is connected to its corresponding bit line BL1 or BL2, and the other one of the source and drain of the cell transistor 41 is connected to its corresponding cell capacitor 42. The plurality of thus configured memory cells, the plurality of bit lines BL, and the plurality of sub-word lines SWL are formed on the memory chip 10, while the sense amplifier for amplifying the potential of the bit line BL and the sub-word driver for driving the sub-word line SWL are integrated on the logic chip 20.

Figure 5:
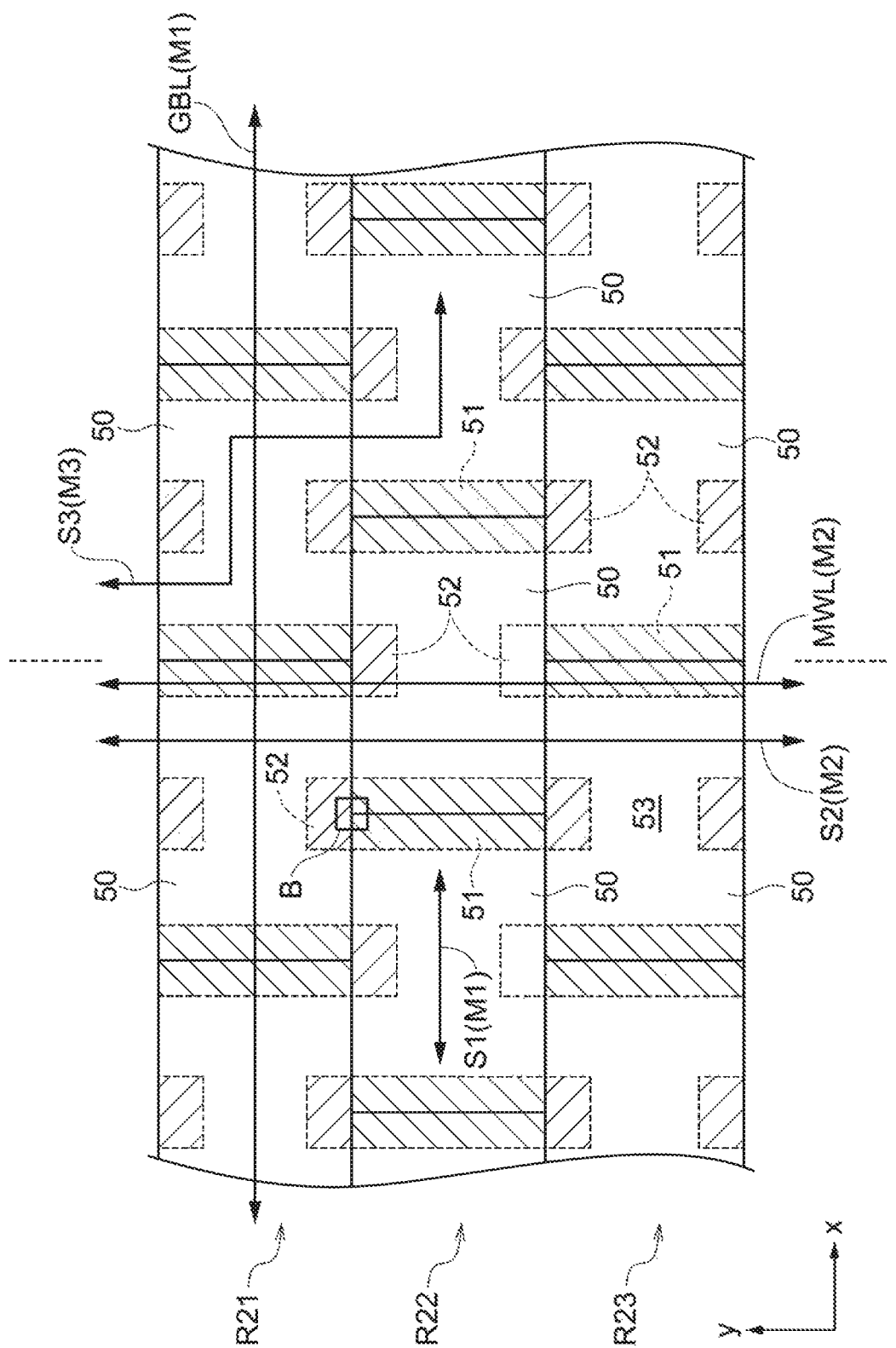
FIG. 5 is a schematic plan view of a logic chip according to an embodiment of the disclosure.

As illustrated in FIG. 5, the logic chip 20 has a plurality of unit regions 50. The position, shape, size, and the number of the plurality of unit regions 50 correspond to those of the plurality of memory cell arrays 30 provided on the memory chip 10. That is, the logic chip 20 has unit rows R21, R22, R23, . . . in each of which the plurality of unit regions 50 are arranged in the x-direction, and the unit rows R21, R22, R23, . . . are arranged in the y-direction. The x-direction positions of the unit region 50 constituting the unit rows adjacent to each other in the y-direction are shifted by a half pitch. For example, the x-direction positions of the unit region 50 constituting the unit row R21 and the x-direction positions of the unit region 50 constituting the unit row R22 are shifted by a half pitch, and the x-direction positions of the unit region 50 constituting the unit row R22 and the x-direction positions of the unit region 50 constituting the unit row R23 are shifted by a half pitch. The x-direction positions of the unit region 50 constituting the unit row R21 and the x-direction positions of the unit region 50 constituting the unit row R23 are aligned.

When the memory chip 10 and the logic chip 20 are hybrid bonded, the plurality of memory cell arrays 30 included in the memory chip 10 and the unit regions 50 included in the logic chip 20 completely overlap each other as viewed in the lamination direction (z-direction).

In the present embodiment, as illustrated in FIG. 5, a sense amplifier region 51 is disposed at both end portions of each unit region 50 in the x-direction, and a sub-word driver region 52 is disposed at both end portions of each unit region 50 in the y-direction. The sense amplifier region 51 is a region where transistors constituting the sense amplifier and the bonding electrodes BE2 connected to the bit line BL are disposed and overlaps the bit line bonding region 31 of FIG. 3. The sub-word driver region 52 is a region where transistors constituting the sub-word driver and the bonding electrodes BE2 connected to the sub-word line SWL are disposed and overlaps the word line bonding region 32 of FIG. 3.

The width of the sense amplifier region 51 in the y-direction is almost equal to the width of the unit region 50 in the y-direction. Thus, the edge of the unit region 50 in the x-direction is entirely covered with the sense amplifier region 51. On the other hand, the width of the sub-word driver region 52 in the x-direction is smaller than the width of the unit region 50 in the x-direction, and thus the edge of the unit region 50 in the y-direction is not completely covered with the sense amplifier region 51 and the sub-word driver region 52. Further, a part of the unit region 50 that is not covered with the sense amplifier region 51 and the sub-word driver region 52 is utilized as a peripheral circuit region 53 where various logic circuits other than the sense amplifier and sub-word driver, such as an address latch circuit, a command decoder, an address decoder, a FIFO circuit, a mode register, a DLL circuit, and a power supply circuit are disposed. In the present embodiment, the peripheral circuit region 53 has an H-shape as viewed in the lamination direction (z-direction).

Figure 6:
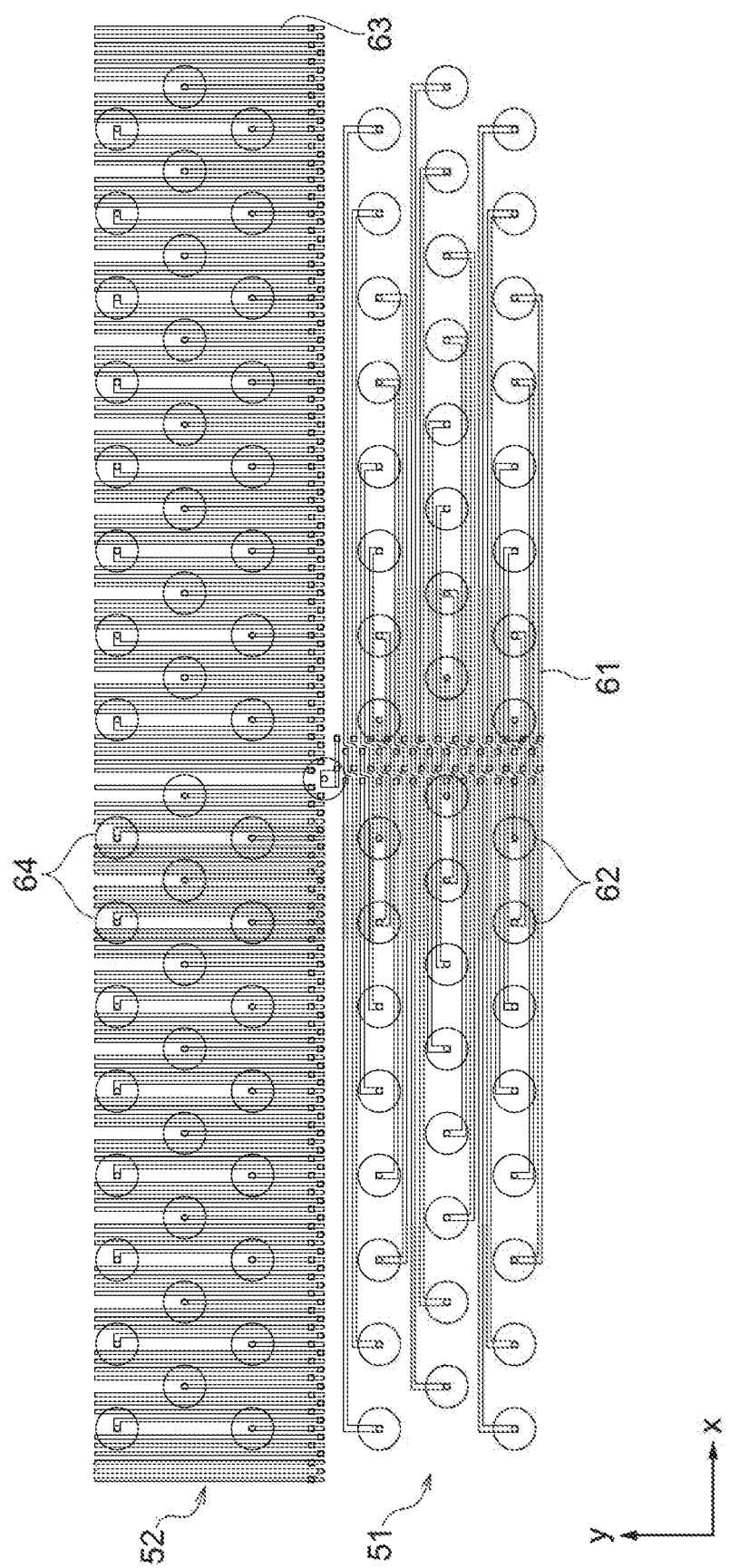
FIG. 6 is an enlarged plan view of a region B shown in FIG. 5.

As illustrated in FIG. 6, the sense amplifier region 51 includes a plurality of signal wirings 61 arranged in the y-direction at the same pitch as that of the bit lines BL and bonding electrodes 62 connected to the end portions of the respective signal wirings 61 in the x-direction. The x-direction distance between the end portions of the signal wirings 61 adjacent in the y-direction is set to several times the arrangement pitch of the signal wirings 61. This increases the pitch of the signal wirings 61 to the pitch of the bonding electrodes 62. Further, in the present embodiment, the bonding electrodes 62 are arranged in zigzag, so that the distance between the bonding electrodes 62 adjacent in the y-direction is also increased. The sub-word driver region 52 includes a plurality of signal wirings 63 arranged in the x-direction at the same pitch as that of the sub-word line SWL and bonding electrodes 64 connected to the end portions of the respective signal wirings 63 in the y-direction. The y-direction distance between the end portions of the signal wirings 63 adjacent in the x-direction is set to several times the arrangement pitch of the signal wirings 63. This increases the pitch of the signal wirings 63 to the pitch of the bonding electrodes 64. Further, in the present embodiment, the bonding electrodes 64 are arranged in zigzag, so that the distance between the bonding electrodes 64 adjacent in the x-direction is also increased.

In the present embodiment, the plurality of memory cell arrays 30 included in the memory chip 10 are laid out in zigzag, so that the plurality of unit regions 50 included in the logic chip 20 can also be laid out in zigzag. Thus, as illustrated in FIG. 5, the positions of the sense amplifier regions 51 allocated to the unit regions 50 adjacent in the y-direction are shifted by a half pitch in the x-direction and, similarly, the positions of the sub-word driver regions 52 allocated to the unit regions 50 adjacent in the y-direction are shifted by a half pitch in the x-direction. Thus, in the wiring layer M3, regions where the bonding electrode BE2 is formed are arranged in zigzag, so that it is possible to freely route a wiring S3 formed on the wiring layer M3 in the x- and y-directions. The wiring S3 formed on the wiring layer M3 does not pass the sense amplifier region 51 and sub-word driver region 52, so that even when a signal asynchronous with operation of the sense amplifier or sub-word driver is transmitted, the signal does not become noise to the sense amplifier or sub-word driver.

The wiring layer M1 is a layer on which wirings extending in the x-direction are disposed, and the wiring layer M2 is a layer on which wirings extending in the y-direction are disposed. In this case, as illustrated in FIG. 5, a global bit line GBL extending in the x-direction can be disposed on the wiring layer M1, and a main word line MWL extending in the y-direction can be disposed on the wiring layer M2. Further, on the wiring layer M2, another wiring S2 can be disposed so as to pass between the sense amplifier regions 51 adjacent in the y-direction. The wiring S2 also does not pass the sense amplifier region 51 and the sub-word driver region 52, a signal passing through the wiring S2 does not become noise to the sense amplifier or sub-word driver. Further, on the wiring layer M1, a wiring S1 connected to the transistors constituting the peripheral circuit region 53 can be disposed. The wiring S1 also does not pass the sense amplifier region 51 and sub-word driver region 52, a signal passing through the wiring S1 does not become noise to the sense amplifier or sub-word driver.

Figure 7:
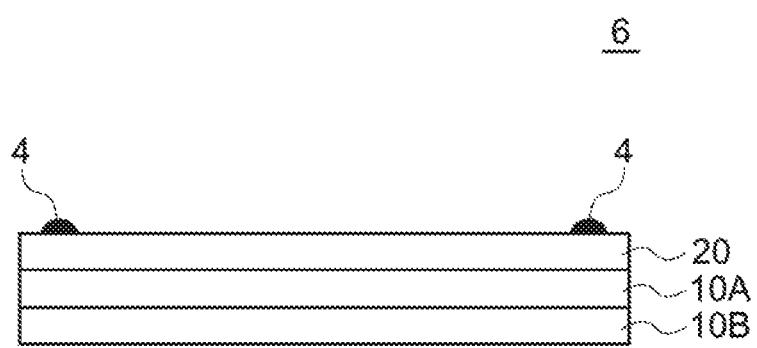
FIG. 7 is a schematic diagram illustrating an outer appearance of a semiconductor device according to a second embodiment.
Figure 8:
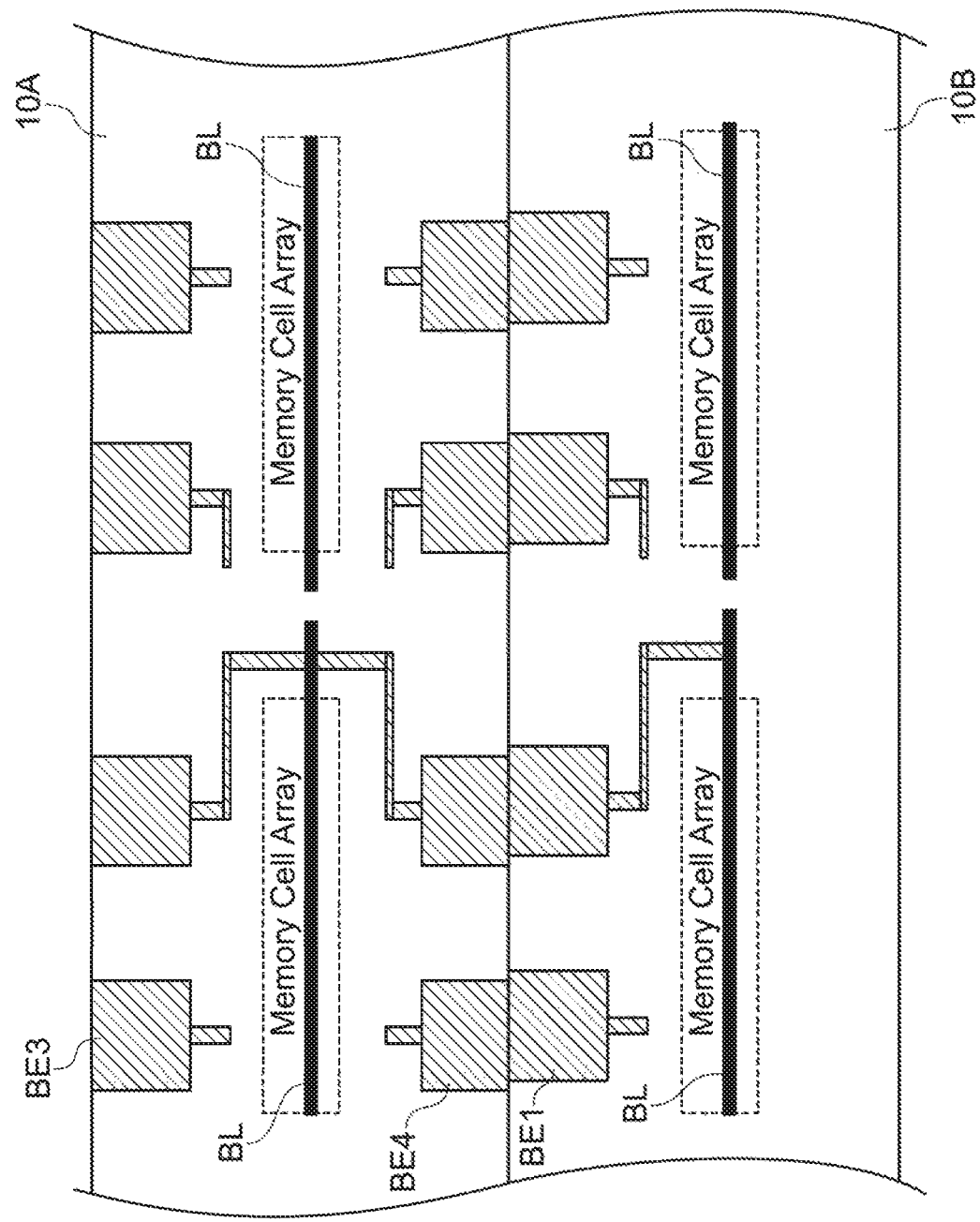
FIG. 8 is a schematic cross-sectional view of memory chips taken along bit lines according to an embodiment of the disclosure.
Figure 9:
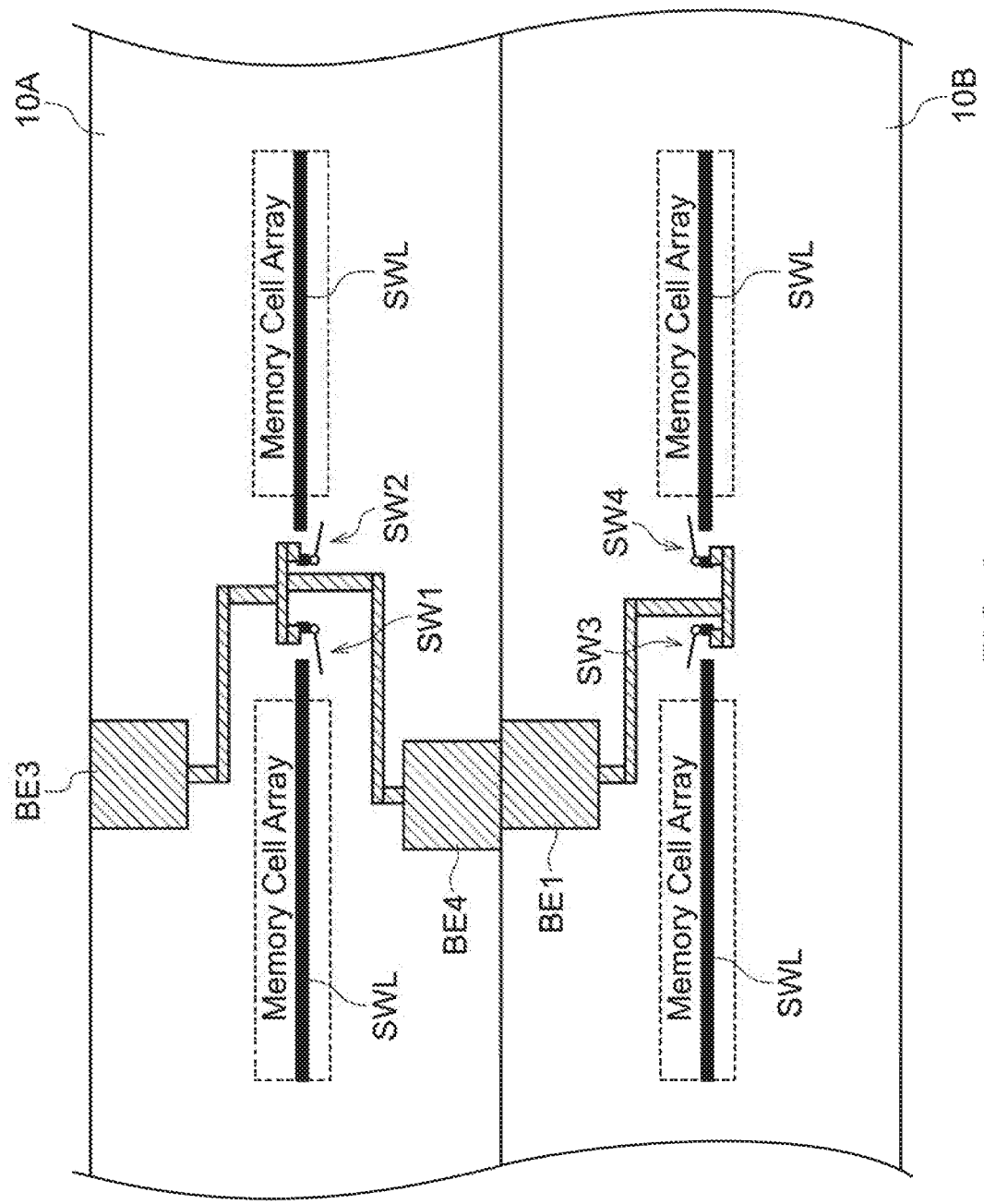
FIG. 9 is a schematic cross-sectional view of memory chips taken along sub-word lines according to an embodiment of the disclosure.

As illustrated in FIG. 7, a semiconductor device 6 according to a second embodiment of the present invention has a configuration in which two memory chips 10A and 10B and a logic chip 20 are laminated. As illustrated in FIGS. 8 and 9, the memory chip 10A includes bonding electrodes BE3 and BE4 on both surfaces thereof. The memory chip 10B is a chip having the same configuration as that of the memory chip 10 used in the first embodiment and includes bonding electrodes BE1 on one surface thereof. The bonding electrodes BE4 of the memory chip 10A are connected respectively to the bonding electrodes BE1 of the memory chip 10B. The bonding electrodes BE3 of the memory chip 10A are connected respectively to the bonding electrodes BE2 of the logic chip 20.

FIG. 8 illustrates the connection relationship between the bit line BL and the bonding electrodes BE1, BE3, and BE4, and FIG. 9 illustrates the connection relationship between the sub-word line SWL and the bonding electrodes BE1, BE3, and BE4. As illustrated in FIGS. 8 and 9, the bonding electrodes BE1, BE3, and BE4 whose positions are aligned in the lamination direction are mutually short-circuited. The bit lines BL are directly connected respectively to their corresponding bonding electrodes BE1, BE3, and BE4, while the sub-word lines SWL are connected respectively to their corresponding bonding electrodes BE1, BE3, and BE4 via switches SW1 to SW4. The switches SW1 to SW4 are operated such that one of them is turned ON based on a selection signal supplied via another bonding electrode (not illustrated), and the remaining switches are turned OFF. Thus, when a sub-word signal supplied from the sub-word driver region 52 of the logic chip 20 is activated, one of the four sub-word lines SWL illustrated in FIG. 9 is activated, and a memory cell connected to the activated sub-word line SWL is accessed. Data read out from the memory cell is supplied to the sense amplifier region 51 of the logic chip 20 via one of the bit lines BL illustrated in FIG. 8.

As described above, in the present embodiment, two memory chips 10A and 10B are laminated on the logic chip 20, so that it is possible to obtain a memory capacity twice as much as that in the semiconductor device 2 according to the first embodiment.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

For example, although the DRAM is exemplified as an application target of the present invention, the present invention may be applied to other RAMs such as an MRAM.

The invention claimed is:

1. An apparatus comprising:
   a first semiconductor chip comprising:
      a first plurality of memory cell arrays, each disposed on an associated one of intersections of first and second signal lines;
      a first plurality of bonding electrodes electrically connected respectively to corresponding first signal lines; and
      a first plurality of switches configured to respectively couple one of the second signal lines to a corresponding one of the first plurality of bonding electrodes; and
   a second semiconductor chip comprising:
      a second plurality of memory cell arrays, each disposed on an associated one of intersections of third and fourth signal lines;
      a second plurality of bonding electrodes respectively coupled to the first plurality of bonding electrodes of the first semiconductor chip and electrically connected respectively to corresponding third signal lines;
      a third plurality of bonding electrodes electrically connected respectively to corresponding third signal lines and coupled to a logic chip; and
      a second plurality of switches configured to respectively couple one of the fourth signal lines to a corresponding one of the second and third plurality of bonding electrodes;
   wherein the first and second plurality of switches are configured to turn on/off so that one memory cell array of the first semiconductor chip and the second semiconductor chip is accessed through a corresponding one of the third plurality of bonding electrodes to the logic chip.

2. The apparatus of claim 1, wherein the second plurality of bonding electrodes and the third plurality bonding electrodes are disposed on opposite sides of the second semiconductor chip.

3. The apparatus of claim 1, wherein the second semiconductor chip is stacked on the first semiconductor chip and is also sandwiched between the logic chip and the first semiconductor chip.

4. The apparatus of claim 1, wherein the first and third signal lines are bit lines and the second and fourth signal lines are sub-word lines.

5. The apparatus of claim 1, wherein the first and second plurality of switches are configured to couple a sub-word signal supplied from a sub-word driver of the logic chip to one of the fourth signal lines through one of the third plurality of bonding electrodes in the second semiconductor chip.

6. The apparatus of claim 1, wherein the first and second plurality of switches are configured to couple a sub-word signal supplied from a sub-word driver of the logic chip to one of the second signal lines through corresponding bounding electrodes from the first, second and third plurality of bonding electrodes.

7. The apparatus of claim 6, wherein the first and second semiconductor chips are laminated to the logic chip in a lamination direction, and wherein the corresponding bonding electrodes from the first, second and third plurality of bonding electrodes are aligned in the lamination direction.

8. The apparatus of claim 1, wherein the first and second semiconductor chips are laminated to the logic chip in a lamination direction, and wherein corresponding bonding electrodes from the first, second and third plurality of bonding electrodes are aligned in the lamination direction and configured to couple a bit line signal from the logic circuit to a corresponding signal line in the third signal lines and to a corresponding signal line in the first signal lines.

9. An apparatus comprising:
   a first semiconductor chip comprising:
      a first plurality of memory cell arrays, each disposed on an associated one of intersections of first and second signal lines;
      a first plurality of bonding electrodes disposed on a top side of the first semiconductor chip; and
      a first plurality of switches respectively coupled between one of the second signal lines and a corresponding one of the first plurality of bonding electrodes; and
   a second semiconductor chip comprising:
      a second plurality of memory cell arrays, each disposed on an associated one of intersections of third and fourth signal lines;
      a second plurality of bonding electrodes disposed on a bottom side of the second semiconductor chip;
      a third plurality of bonding electrodes disposed on a top side of the second semiconductor chip; and
      a second plurality of switches respectively coupled between one of the fourth signal lines and a corresponding one of the second plurality of bonding electrodes and a corresponding one of the third plurality of bonding electrodes;
   wherein the first and second plurality of switches are configured to couple a sub-word signal from a sub-word driver of a logic chip to one of corresponding memory cell arrays in the first semiconductor chip and the second semiconductor chip.

10. The apparatus of claim 9, wherein the second semiconductor chip is stacked on the top side of the first semiconductor chip in a vertical direction and the logic chip is laminated to the top side of the second semiconductor chip.

11. The apparatus of claim 9, wherein the second plurality of switches are configured to couple the sub-word signal to one of the fourth signal lines through one of the third plurality of bonding electrodes in the second semiconductor chip responsive to a selection signal.

12. The apparatus of claim 9, wherein the first and second plurality of switches are configured to couple the sub-word signal to one of the second signal lines through corresponding bounding electrodes from the first, second and third plurality of bonding electrodes responsive to a selection signal.

13. An apparatus comprising:
   a logic circuit comprising a sub-word driver circuit;
   a first semiconductor chip comprising:
      a first plurality of memory cell arrays each including a plurality of first signal lines extending in a first direction, a plurality of second signal lines extending in a second direction different from the first direction, and a plurality of memory cells each disposed on an associated one of intersections of the plurality of first and plurality of second signal lines; and
      a first plurality of switches configured to couple a sub-word signal to one of the first plurality of memory cell arrays; and
   a second semiconductor chip comprising:

a second plurality of memory cell arrays each including a plurality of third signal lines extending in the first direction, a plurality of fourth signal lines extending in the second direction, and a plurality of memory cells each disposed on an associated one of intersections of the plurality of third and the plurality of fourth signal lines; and a second plurality of switches coupled to couple a sub-word signal from a sub-word driver circuit of the logic chip to one of the fourth signal lines;

wherein the second semiconductor chip is sandwiched between the logic chip and the first semiconductor chip.

14. The apparatus of claim 13, wherein the first and second semiconductor chips are stacked in a vertical direction.

15. The apparatus of claim 14, wherein a bit line from the logic chip is coupled to a corresponding signal line in the third signal lines in the second semiconductor chip and also to a corresponding signal line in the first signal lines in the first semiconductor chip.

16. The apparatus of claim 15, wherein the bit line from the logic chip is coupled to the corresponding signal line in the third signal lines in the second semiconductor chip and also to the corresponding signal line in the first signal lines in the first semiconductor chip via one or more bonding electrodes aligned in the vertical direction.

17. The apparatus of claim 14, the sub-word signal from the logic chip is coupled to a corresponding signal line in the fourth signal lines in the second semiconductor chip or to a corresponding signal line in the second signal lines in the first semiconductor chip.

18. The apparatus of claim 17, wherein the sub-word signal from the logic chip is coupled to the corresponding signal line in the fourth signal lines in the second semiconductor chip or to the corresponding signal line in the second signal lines in the first semiconductor chip via one or more bonding electrodes aligned in the vertical direction.

19. The apparatus of claim 17, wherein the sub-word line from the logic chip is coupled to the corresponding signal line in the fourth signal lines in the second semiconductor chip or to the corresponding signal line in the second signal lines in the first semiconductor chip via the first and second plurality of switches.

20. The apparatus of claim 19, wherein:
the corresponding signal line in the fourth signal lines is coupled to a corresponding switch of the second plurality of switches;
the corresponding signal line in the second signal lines is coupled to a corresponding switch of the first plurality of switches; and
one of the corresponding switch of the second plurality of switches and the corresponding switch of the first plurality of switches is turned on to allow the sub-word signal to activate a first memory cell array associated with the corresponding signal line in the second signal lines or activate a second memory cell array associated with the corresponding signal line in the fourth signal lines so that one of the first and second memory cell arrays is accessed by the logic chip at a time.

* * * * *